(12) United States Patent
Mulkens et al.

(10) Patent No.: US 7,508,487 B2
(45) Date of Patent: Mar. 24, 2009

(54) LITHOGRAPHIC APPARATUS, DEVICE MANUFACTURING METHOD, AND DEVICE MANUFACTURED THEREBY

(75) Inventors: Johannes Catharinus Hubertus Mulkens, Maastricht (NL); Paul Van Der Veen, Eindhoven (NL); Willem Van Schaik, Den Bosch (NL); Vadim Yevgenyevich Banine, Helmond (NL); Levinus Pieter Bakker, Helmond (NL); Johannes Hubertus Josephina Moors, Helmond (NL); Heine Melle Mulder, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 486 days.

(21) Appl. No.: 10/719,065

(22) Filed: Nov. 24, 2003

(65) Prior Publication Data

US 2004/0160583 A1 Aug. 19, 2004

Related U.S. Application Data

(63) Continuation-in-part of application No. 10/373,192, filed on Feb. 26, 2003, now abandoned, which is a continuation of application No. 09/866,875, filed on May 30, 2001, now Pat. No. 6,538,716.

(30) Foreign Application Priority Data

| Jun. 1, 2000 | (EP) | .................. 00304673 |
| Jun. 6, 2000 | (EP) | .................. 00304760 |

(51) Int. Cl.
*G03B 27/52* (2006.01)
*G03B 27/42* (2006.01)
*G03B 27/54* (2006.01)

(52) U.S. Cl. ............................ 355/30; 355/53; 355/67

(58) Field of Classification Search ................ 355/30, 355/53, 55, 67, 77; 250/492.2, 492.22, 548; 430/311, 312
See application file for complete search history.

(56) References Cited

U.S. PATENT DOCUMENTS

| 4,825,453 | A | 4/1989 | Kembo et al. |
| 5,229,872 | A | 7/1993 | Mumola |
| 5,250,797 | A | 10/1993 | Asahina et al. |

(Continued)

FOREIGN PATENT DOCUMENTS

EP 0 843 152 A2 5/1998

(Continued)

OTHER PUBLICATIONS

Translation of Japanese Office Action issued in Japanese Appln. No. 2001-161590 mailed Jul. 21, 2006.

(Continued)

*Primary Examiner*—Peter B Kim
(74) *Attorney, Agent, or Firm*—Sterne, Kessler, Goldstein & Fox P.L.L.C.

(57) ABSTRACT

In a lithographic projection system, the radiation energy delivered to the substrate needs to be accurately controlled. Attenuation by injecting an absorbent gas into a volume through which the radiation passes is a convenient way to control the energy. Additionally, the interaction between gasses and the radiation may be used to measure the energy of the radiation with minimal disruption to the radiation.

55 Claims, 10 Drawing Sheets

U.S. PATENT DOCUMENTS

| | | | |
|---|---|---|---|
| 5,296,891 A | 3/1994 | Vogt et al. | |
| 5,347,561 A | 9/1994 | Ebinuma | |
| 5,467,637 A | 11/1995 | Hasegawa et al. | |
| 5,523,193 A | 6/1996 | Nelson | |
| 5,559,584 A | 9/1996 | Miyaji et al. | |
| 5,812,242 A | 9/1998 | Tokuda | |
| 5,883,704 A | 3/1999 | Nishi et al. | |
| 5,929,977 A | 7/1999 | Ozawa | |
| 5,969,441 A | 10/1999 | Loopstra et al. | |
| 6,046,792 A | 4/2000 | Van Der Werf et al. | |
| 6,240,610 B1* | 6/2001 | Ishihara et al. | 29/25.01 |
| 6,262,796 B1 | 7/2001 | Loopstra et al. | |
| 6,288,769 B1* | 9/2001 | Akagawa et al. | 355/30 |
| 6,353,219 B1* | 3/2002 | Kley | 250/234 |
| 6,414,743 B1* | 7/2002 | Nishi et al. | 355/69 |
| 6,455,862 B1 | 9/2002 | Van der Veen et al. | |
| 6,538,716 B2* | 3/2003 | Mulkens et al. | 355/30 |
| 6,545,746 B1* | 4/2003 | Nishi | 355/53 |
| 6,813,004 B1 | 11/2004 | Horikoshi et al. | |
| 2001/0015795 A1* | 8/2001 | Nishi | 355/53 |
| 2001/0030740 A1* | 10/2001 | Mori et al. | 355/53 |
| 2002/0159042 A1* | 10/2002 | Poon | 355/53 |
| 2003/0020888 A1* | 1/2003 | Tanaka et al. | 355/30 |
| 2003/0025890 A1* | 2/2003 | Nishinaga | 355/53 |

FOREIGN PATENT DOCUMENTS

| | | | |
|---|---|---|---|
| EP | 1 122 609 A2 | 8/2001 | |
| EP | 1 143 491 A1 | 10/2001 | |
| JP | 5-291114 A | 11/1993 | |
| JP | 7-92317 A | 4/1995 | |
| JP | 10-284410 A | 10/1998 | |
| JP | 11-87230 A | 3/1999 | |
| JP | 11-354409 A | * 12/1999 | |
| JP | 2000-306807 A | 11/2000 | |
| JP | 2003-257822 | * 9/2003 | |
| WO | WO 98/33096 A1 | 7/1998 | |
| WO | WO 98/38597 A2 | 9/1998 | |
| WO | WO 98/38597 A3 | 9/1998 | |
| WO | WO 99/52130 A1 | 10/1999 | |
| WO | WO 00/31780 A1 | 6/2000 | |

OTHER PUBLICATIONS

European Search Report, EP 01 30 4678, mailed Jul. 6, 2004, 3 pgs.

* cited by examiner

LITHOGRAPHIC APPARATUS, DEVICE MANUFACTURING METHOD, AND DEVICE MANUFACTURED THEREBY

CROSS-REFERENCE TO RELATED APPLICATIONS

This is a continuation in part of U.S. application Ser. No. 10/373,192, filed Feb. 26, 2003, now abandoned, the entire contents of which are hereby incorporated by reference. U.S. application Ser. No. 10/373,192 is a continuation of U.S. application Ser. No. 09/866,875, filed May 30, 2001, now U.S. Pat. No. 6,538,716, the entire contents of which are hereby incorporated by reference.

BACKGROUND OF THE INVENTION

1. Field of the Invention

The present invention relates generally to a lithographic projection apparatus, and more specifically, to a lithographic projection apparatus including radiation energy measurement, radiation absorber control, or both.

2. Description of the Related Art

The term "patterning structure" as here employed should be broadly interpreted as referring to structure that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning structure is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning structure is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and WO 98/38597 and WO 98/33096. In the case of a programmable mirror array, the support may be embodied as a frame or table, for example, which may be fixed or movable as required.

Another example of a patterning structure is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam of radiation in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is desirable to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In a lithographic projection apparatus it is desirable to ensure that the transmissivity of the radiation system and the projection system for radiation of the beam is substantially stable during an exposure of a target portion. This facilitates appropriate control over dose ("dose control"). Dose is defined as the total energy per unit area delivered to the substrate during an exposure of a target portion. Preferably, the transmissivity shall be substantially stable during a plurality of exposures of adjacent target portions such as to avoid a necessity of intermediate dose calibrations. It is known that instability of transmissivity can occur due to, for example, an interaction between the beam of radiation and materials of optical elements of the radiation and projection system. Known transient variations in the transmissivity of the optical elements can be corrected for via a feed-forward control. See, for example, U.S. Pat. No. 6,455,862.

For shorter wavelength radiation, especially for wavelength of 170 nm and below, absorption by air (through the presence of oxygen) becomes significant. Therefore, the optical path of the lithographic apparatus is evacuated or flushed ("purged") with a gas (a "purge gas") transparent to the radiation used, commonly dry $N_2$. In spite of the above known precautions, there is the problem of significant transmissivity variations due to, for example, the presence of residual oxygen in the optical path, and leading to undesirable production errors. Evacuating the optical path to a high degree may reduce these causes of transmissivity losses even further, but transmissivity variations due to, for example, contamination or degradation of optical elements may still pose a problem. This is especially true at wavelengths of 20 nm and below.

At any wavelength, localized transmissivity changes may occur that may not be detectable by a dose control system. These localized changes may affect the energy of a region of the beam of radiation and consequently may cause incorrect imaging of a corresponding region on the target portion of the substrate. It is known in the art that these uniformity deviations may be corrected using a so-called "gray-filter", which reduces the radiation in the regions with the highest energy down to the radiation in the regions of lowest energy. Refractive gray-filters may be manufactured, for example, by evaporating an appropriate metal onto specific regions of a transparent substrate. The gray-filter can be placed at any point in the optical path of the beam of radiation, but it is typically placed in the unpatterned beam of radiation between the source and the patterning device. This does not mean, however, that only uniformity deviations between the source and the patterning structure can be corrected—the fact that the measurement of the energy uniformity is typically done at substrate level means that the resulting gray-filter will create a uniform energy profile at substrate level independent of the position in the optical path where the transmissivity change has occurred. Gray-filters have the disadvantage, however, that they are manufactured based upon a single measurement, which means that they cannot respond dynamically to transmissivity changes or to changes in the operating mode.

A relatively inexpensive (for example, compared to using an expensive and bulky CCD camera) way of measuring the radiation uniformity is to use a photo-chromic material, such as UV SensorCards supplied by SensorPhysics (www.sensorphysics.com). These SensorCards are coated with a thin layer of polymer that changes its optical density upon exposure to photons to a degree that is proportional to the exposure intensity. The color change is instant and irreversible and no processing of the photo-chromatic material is required. Such polymers are used routinely with the ultraviolet (UV) and deep ultra violet (DUV) lithographic projection systems for measuring the energy profile in any cross-section of the beam of radiation (e.g. at intermediate focus, reticle, pupils, wafer or field facets) because it will give a footprint of the beam with very high resolution. An exposed SensorCard can be further read out with a standard computer scanner and processed with imaging software to increase the reproducibility of the measurement. It has been recently demonstrated that these polymers also respond to the wavelengths 5-20 nm (EUV) with a reasonable linearity and dynamic range to allow accurate measurements to be performed. However, these SensorCards can only be used once, and the disruption they cause to the radiation profile means that they cannot be left in the apparatus during normal operation.

SUMMARY OF THE INVENTION

An aspect of the present invention is to provide improved control over transmissivity variations of the lithography apparatus.

This and other aspects are achieved according to the present invention in a lithographic apparatus for imaging a pattern onto a substrate that is at least partially covered by a layer of radiation-sensitive material, the apparatus including a radiation system configured to provide a beam of radiation; a support configured to support a patterning structure, the patterning structure configured to produce a desired pattern in the beam of radiation; a substrate table configured to hold a substrate; a projection system configured to project the patterned beam of radiation onto a target portion of the substrate; and a radiation absorber including a gas supply configured to supply an absorbent gas at a controlled concentration to at least one volume traversed by the beam of radiation, the absorbent gas serving to absorb radiation energy delivered by the patterned beam of radiation to the substrate during exposure of the radiation-sensitive material to the patterned beam of radiation.

The absorbent gas serves to absorb (attenuate) radiation of the wavelength of the beam of radiation. A radiation absorbing system including a gas supply to supply the absorbent gas may function as a partially transmissive optical filter, where the transmissivity can be varied by adjusting the gas composition.

The attenuator will typically be controlled by a suitable controller, which may be arranged, for example, to calculate a prediction of variations in transmissivity (typically increased absorption) that will occur during an exposure of a target portion. With the prediction of transmissivity variations, an appropriate correction to the dose and/or intensity profile can be calculated and adjustments to effectuate the correction can be applied. The adjustments may include, for example, an adjustment in the attenuation by the present invention, an adjustment of the radiation power emitted by a radiation source supplying radiation to the radiation system, or, when the radiation source is operated in a pulsed mode, an adjustment of the number of pulses of radiation emitted by the radiation source during an exposure of a target portion.

Conventionally, the dose delivered in an exposure is controlled by varying the radiation power or the duration of the exposure, or both. An energy sensor is typically provided at a convenient position in the radiation system, to measure the output of a radiation source supplying radiation to the radiation system. The output as measured provides the basis for a feedback control and adjustment of, for example, the radiation power emitted by the source or the exposure duration.

An adjustment determined to be necessary to compensate for transmissivity changes in the regions traversed by the beam of radiation can be combined with adjustments determined to be necessary to compensate for other factors, e.g. variations in the radiation source output, changes in the transmission of optical elements in the projection and/or radiation systems, or absorption by gas present in a region traversed by the beam of radiation.

Input for the controller can also be, for example, measurement results representative of gas composition in a disk-shaped region substantially comprising a pupil plane of the projection system (or a plane conjugate to the pupil plane in either the radiation system or the projection system). The controller can, in this example, be arranged to predict and adjust the angular distribution of radiation energy delivered to the substrate during an exposure of a target portion. The detection of gas composition preferably includes measurement of the levels of gases known to absorb radiation of the wavelength of the beam of radiation, e.g. oxygen and water.

The radiation absorbing system in a simple form includes at least a partial enclosure having end faces substantially transparent to the radiation of the beam of radiation, e.g. made of $CaF_2$, together with a supply of the absorbent gas connected to the enclosure via a control valve. A further valve controls the exit of gas from the region enclosed by the enclosure, which may be effected using a vacuum pump. For simplicity, an enclosure with end faces, as described above, may hereinafter be referred to as a "chamber". The pressure and/or density of the gas in the chamber is controlled so as to provide the desired attenuation of the beam of radiation. The gas inlets and outlets are arranged so that the gas concentration/density in the chamber is uniform so that the beam is uniformly attenuated.

In more complex forms, the radiation absorbing system is arranged to provide a non-uniform concentration of absorbent gas so as to have a desired beam-shaping effect. This can be achieved with an array of individually controllable gas (micro-)jets allowing local control of the absorbent gas concentration or an arrangement of inlets and outlets configured to create an absorbent gas concentration gradient.

The positioning of the radiation absorbing system depends on the use to which it is put. If used for overall control of the dose (as defined above) it can be sited in, for example, the radiation system or, in case a laser is used as radiation source, in the laser beam provided to the radiation system. In the latter case it can be placed, for example, relatively close to the radiation source. For filtering of diffraction orders of radiation diffracted upon traversing the mask, the radiation absorbing system can, for example, be located such as to enclose a pupil plane of the projection system. For shaping the angular distribution of radiation energy of the beam the radiation absorbing system can, for example, be located such as to enclose a plane conjugate to the pupil plane, for example, in the radiation system. For control of energy variations across the scanning slit, the radiation absorbing system can, for example, be placed near the substrate or near the mask, or it can be placed such as to include a plane conjugate to the mask.

The volume to which the radiation absorbent gas is supplied may be free of other gases or may include other gases transparent to the radiation of the projection beam. For a beam of radiation with a wavelength of, for example, 157 nm, $O_2$ may be used as the radiation absorbing gas while $N_2$ may also be present as a non-absorbing purge gas.

Where a flow of radiation absorbing gas through the radiation absorbing system is provided, this can be used to carry away the heat generated on absorption of the radiation of the projection beam. Also, since the radiation beam traversing the absorbing gas may induce a chemical effect in the absorbing gas (and therefore induce a change of absorbance) the flow can be used to carry away the affected absorbing gas.

According to a further aspect of the present invention there is provided a device manufacturing method projecting a patterned beam of radiation onto a target portion of the layer of radiation-sensitive material at least partially covering a substrate; controlling at least one of an energy of the beam of radiation and a duration of exposure of the radiation-sensitive material to the patterned beam, such that a desired dose of radiation is delivered to the substrate during an exposure; and supplying an absorbent gas according to a concentration profile to a volume traversed by the beam of radiation to effect a desired attenuation of the beam of radiation, the absorbent gas absorbing radiation of the wavelength of the beam of radiation.

According to a still further aspect of the present invention, control over transmissivity variations of the radiation system and the projection system is further improved by measuring the radiation energy with minimal disruption of the beam of radiation.

This and other aspects are achieved according to the invention in a lithographic apparatus for imaging a pattern onto a substrate that is at least partially covered by a layer of radiation-sensitive material, the apparatus including a radiation system configured to provide a beam of radiation; a support configured to support a patterning structure, the patterning structure configured to produce a desired pattern in the beam of radiation; a substrate table configured to hold a substrate; a projection system configured to project the patterned beam of radiation onto a target portion of the substrate; and a radiation-energy detector configured to determine the energy of the beam of radiation, the beam of radiation passing at least partly through a region of interactive gas, the detector including a sensor, the sensor, in operation, providing an output signal wherein the output signal is proportional to the amount of interaction of the beam with the region of gas.

Some of the incoming radiation photons in the beam of radiation are absorbed by the particles (molecules/atoms) in the absorbent gas, leading to a level of luminescence (the emission of radiation from an excited species not in thermal equilibrium with its environment) which is proportional to the energy of the radiation.

In some instances, it may be advantageous to perform the energy measurement proximate the radiation absorbing system because a region of absorbent gas is already present. In other instances, it may be advantageous to separate the radiation absorbing and the radiation energy measurement aspects into separate elements so that each function may be independently optimized. The position of the radiation energy sensor within the lithographic projection apparatus can also be chosen depending on factors such as the available space, the permissible disruption of the beam of radiation and the locations in the optical path where transmissive variations may be expected.

According to yet another aspect of the present invention there is provided a device manufacturing method including projecting a patterned beam of radiation onto a target portion of the layer of radiation-sensitive material at least partially covering a substrate; controlling at least one of an energy of the beam of radiation and a duration of exposure of the radiation-sensitive material to the patterned beam, such that a desired dose of radiation is delivered to the substrate during an exposure; and determining the energy of the radiation by supplying an interactive gas according to a concentration profile to a volume traversed by the radiation, measuring the amount of interaction of the radiation with the interactive gas, wherein results of the measurement are used to control the at least one of the energy and the duration.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

BRIEF DESCRIPTION OF THE DRAWINGS

Embodiments of the present invention will now be described, by way of example only, with reference to the accompanying schematic drawings in which.

In the drawings, like references indicate like parts.

DETAILED DESCRIPTION

Figure 1:
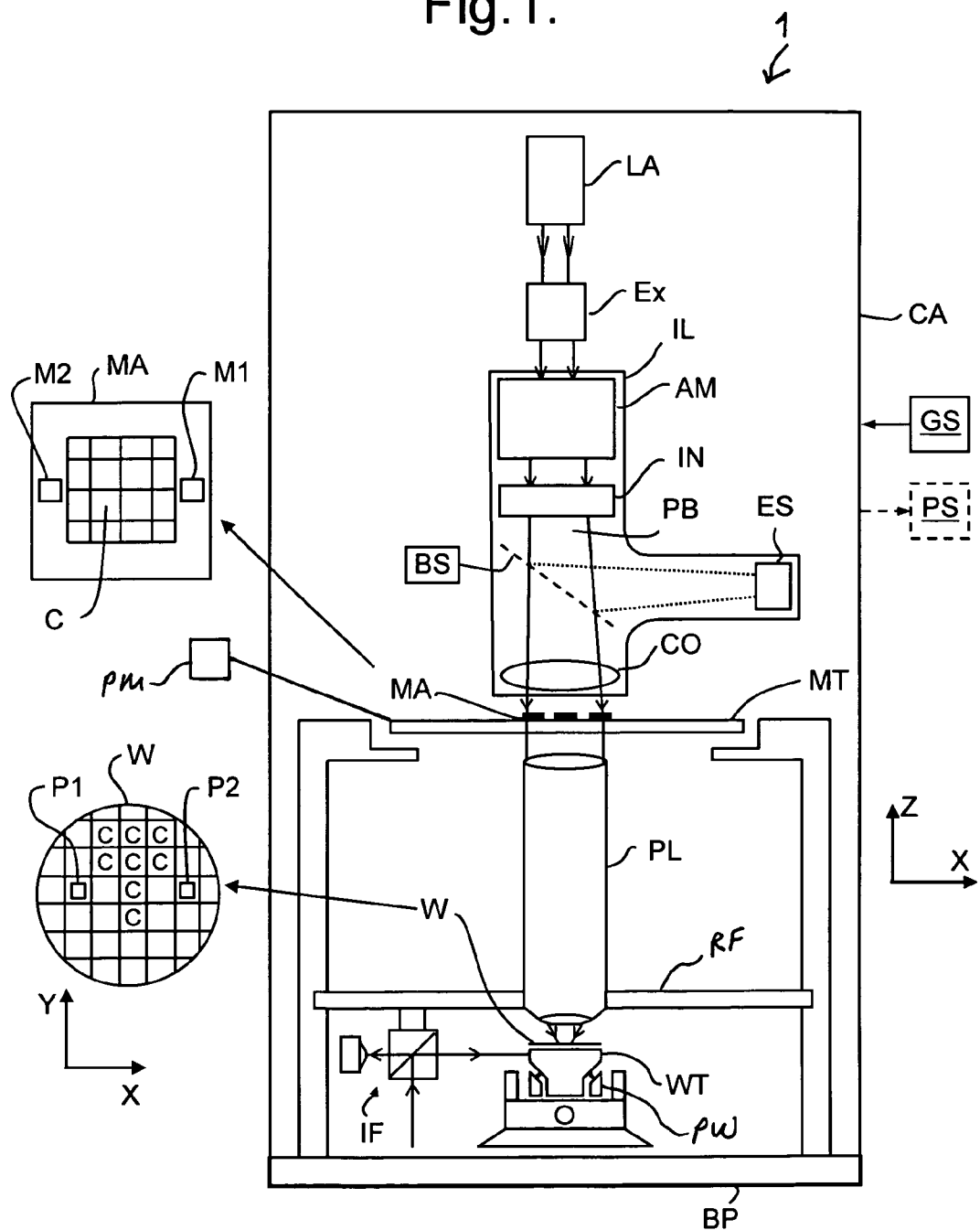
FIG. 1 depicts a lithographic projection apparatus according to the present invention.

FIG. 1 schematically depicts a lithographic projection apparatus 1 according to an embodiment of the present invention. The apparatus includes a base plate BP. The apparatus may also include a radiation source LA (e.g. UV or EUV radiation, such as, for example, generated by an excimer laser operating at a wavelength of 248 nm, 193 nm or 157 nm, or by a laser-fired plasma source operating at 13.6 nm). A first object (mask) table MT is provided with a mask holder configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system or lens PL. The projection system or lens PL (e.g. a quartz and/or $CaF_2$ lens system or a refractive or catadioptric system, a mirror group or an array of field deflectors) is configured to image an irradiated portion of the mask MA onto a target portion C (e.g., comprising one or more dies) of the substrate W. The projection system PL is supported on a reference frame RF. As here depicted, the apparatus is of a transmissive type (i.e. has a transmissive mask). However, in general, it may also be of a reflective type, (e.g. with a reflective mask). Alternatively, the apparatus may employ another kind of patterning structure, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may include an adjusting device AM configured to set the outer and/or inner radial extent (commonly referred to as σ-outer and σ-inner, respectively)

of the intensity distribution in the beam. In addition, it will generally comprise various other components, such as an integrator IN and a condenser CO. In this way, the beam of radiation PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source SO is an excimer laser. The present invention encompasses both of these scenarios.

In particular, the present invention encompasses embodiments wherein the illuminator IL is configured to supply a beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the projection system PL, which focuses the beam PB onto a target portion C of the substrate W. With the aid of the second positioning device PW and interferometric measuring system IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

In the illumination system IL, a part of the beam PB is diverted to an energy sensor ES by a beam splitter BS. Beam splitter BS may be a reflector formed by depositing aluminum on quartz and used to fold the beam to a convenient orientation. A pattern of small holes is etched into the aluminum layer to let a known proportion, e.g. 1%, through to the energy sensor. The output of the energy sensor is used in controlling the dose delivered in an exposure, as described further below.

Particularly in the case where radiation of wavelength 157 nm or below is used, the entire optical path of the apparatus is enclosed in one or more casings CA which can be flushed with a gas, e.g. dry $N_2$, transparent to the radiation used for the beam. The flushing, or purge, gas is supplied from gas supply GS which may be a container of clean gas or a plant for scrubbing and drying air.

More particularly in the case where radiation of wavelength 20 nm or below is used, the entire optical path of the apparatus is enclosed in one or more casings CA which can be evacuated using a vacuum pumping system PS.

Figure 2:
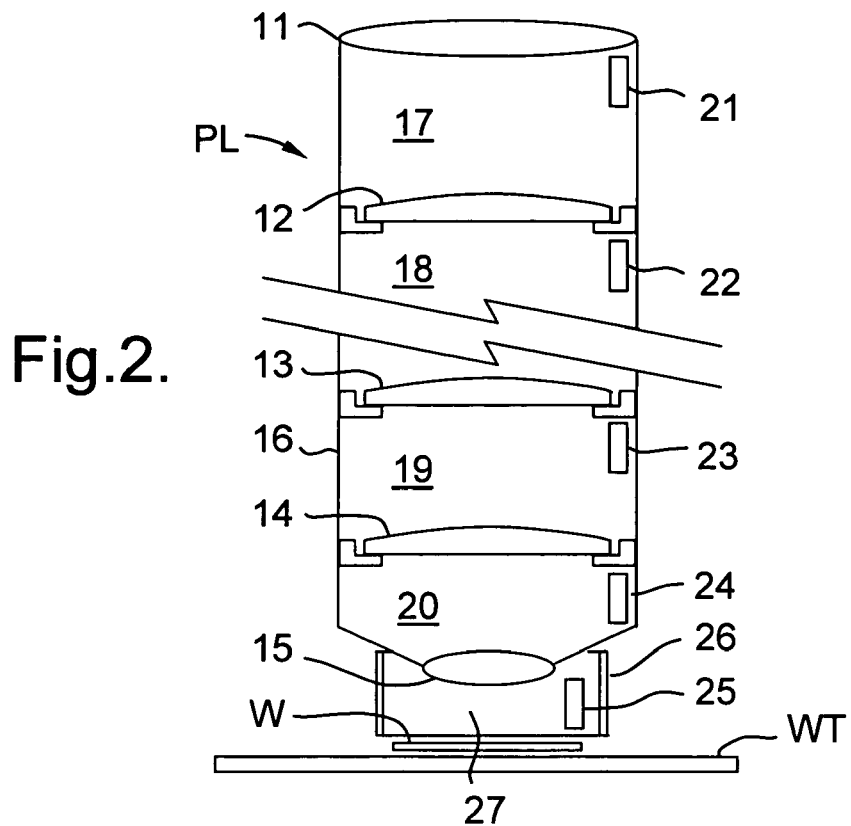
FIG. 2 is a cross-sectional view of the projection system, a substrate and the substrate table according to the present invention.

FIG. 2 shows in cross-section the projection system PL, which comprises a plurality of optical elements 11-15 mounted in a casing 16, and an enclosure 26 between the casing 16 and the substrate table WT. For clarity only five optical elements (lenses) are shown but a projection system PL may in practice include 30 or more elements of a variety of types. The optical elements 11-15 divide the projection optical system into a plurality of chambers 17-20 in each of which is located a gas sensor 21-24. Within the chamber 27 embodied by the enclosure 26 a gas sensor 25 is located.

Gas sensors 21-25 measure the composition of gas contained in the projection lens system and the chamber 27. In particular, the sensors measure the levels of gases known to absorb radiation of the wavelength of the beam, e.g. $O_2$, $O_3$, $H_2O$, and/or hydrocarbons. Additional gas sensors may, for example, be placed in other regions downstream of the beam splitter BS, e.g. in a chamber facing the mask or in chambers within the final stages of the illumination system IL. The gas sensors preferably detect the concentration of the gases of interest by measuring absorption of radiation. The gas sensor may include a radiation source and radiation sensor spaced apart a known distance across the volume where the absorbent gas concentration is to be measured. The radiation source need not emit radiation of the same wavelength as the beam; a correction can be made to the measured absorption of radiation to amount for any difference in transmissivity of the absorbent gases to the radiation used in the sensor and the radiation of the beam. Alternatively, the gas sensor may include a radiation detector arranged to detect absorption of radiation diverted out of the beam. Chemical sensors may also be used, but may have too slow a response time for some applications.

Figure 3:
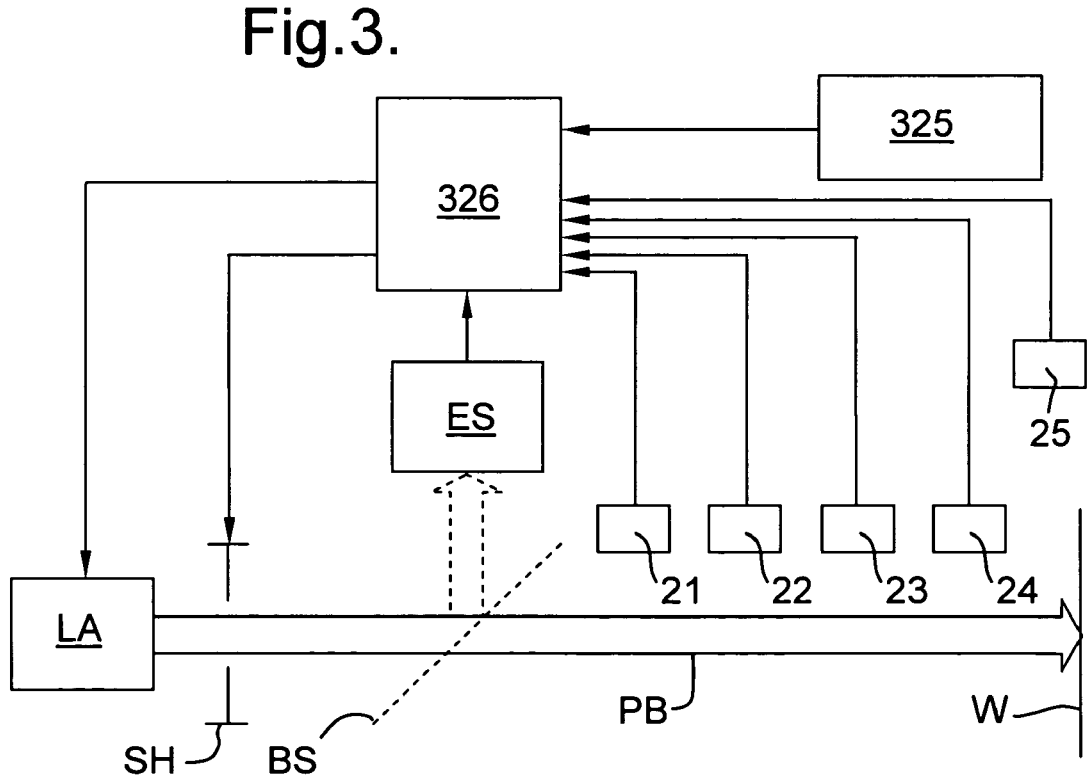
FIG. 3 is a diagram of a control system of the present invention.

FIG. 3 is a diagram of a control system making use of the outputs of the gas sensors 21-25 and the energy sensor ES to control exposures to ensure correct dosage. As shown in FIG. 3 and described above, a portion of the beam PB is diverted to energy sensor ES by beam splitter BS. Energy sensor ES measures the energy of the radiation reaching it and gives a corresponding output which can be used to calculate intensity. This output measures any variation in the energy of radiation supplied by the radiation source LA and any variations in transmissivity along the optical path upstream of beam splitter BS. Gas sensors 21-25 are arrayed to measure gas compositions in regions of the optical path downstream of the beam splitter and provide respective outputs.

The outputs of the energy sensor ES and gas sensors 21-25 are supplied to a control circuit 326. Control circuit 326 derives from the outputs of the gas sensors 21-25 a prediction of the amount of attenuation of the beam PB that will occur downstream of the beam splitter BS and combines this prediction with the energy of the beam as measured by the energy sensor ES to make an approximate determination of the actual energy of the beam at the substrate. The degree of attenuation can be substantially determined from the measured gas compositions by knowledge of, for example, the path length traversed by the beam in each region and the (partial) pressure and density dependence of the transmissivity of the gas components that are measured. Alternatively, it is possible to use empirical values derived using an energy sensor at substrate level to measure attenuation at different concentrations of absorbent gases.

As well as the outputs of energy sensor ES and gas sensors 21-25, the control circuit may take into account other corrections, e.g. provided by a prediction circuit 325 which predicts transient attenuation effects in optical elements downstream of the beam splitter.

Having made the approximate determination of the actual energy of the beam at the substrate, the control circuit effects control of the lithographic projection apparatus to ensure that the correct dose is delivered to the substrate during successive exposures of target portions C. This control may take the form of controlling the power of radiation supplied by the radiation source LA, controlling a variable attenuator or shutter SH in the illumination system, controlling the duration of each exposure, or any combination of these methods. The exposure parameters may be set in advance of each exposure or series of exposures or controlled continuously during exposures to take account of transient effects. The sampling rates of the various sensors are determined accordingly.

Figure 4A:
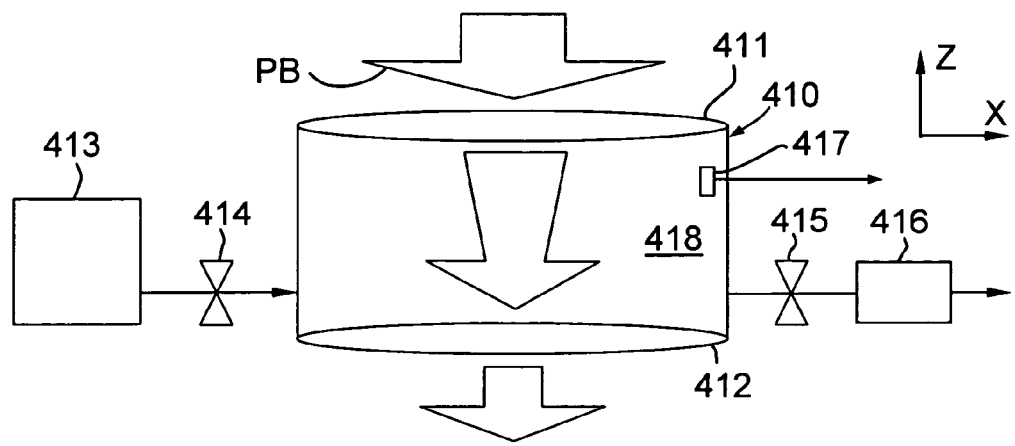
FIG. 4A is a cross-sectional view of a controllable radiation absorber according to the present invention.

FIG. 4A shows in cross-section a radiation attenuator, or radiation absorbing system, according to the present invention. The radiation attenuator includes an enclosure 410 and end faces 411, 412 made of a material, e.g. $CaF_2$, substantially transparent to the radiation of the beam. The enclosure and end faces 410, 411 and 412 define a chamber 418. The end faces may be optical elements provided for other purposes in the illumination or projection systems of the lithographic projection apparatus. A radiation absorbing gas, e.g. $O_2$ when the beam has a wavelength of 157 nm or Xe (xenon) when the wavelength is in the 5-20 nm range, is supplied to the chamber 418 from a supply 413 via first control valve 414. Egress of gas from the chamber is controlled by a second control valve 415 and optional vacuum pump 416.

The amount of absorbent gas in the chamber 418 is controlled to ensure that the beam PB is attenuated to a desired extent as it passes through the chamber 418. The chamber 418 may be supplied with only absorbent gas or with absorbent gas mixed at an appropriate concentration with a transparent gas, e.g. $N_2$.

A sensor 417 may be provided in the chamber 418 to measure the (partial) pressure of the absorbent gas for feedback control. The gas supply may also be controlled responsive to the output of the energy sensor ES or another sensor, e.g. downstream of the radiation attenuator, for sensing the energy of the beam.

The gas inlet(s) and outlet(s) are preferably arranged so that the absorbent gas is evenly distributed in the chamber 418 so as to effect uniform attenuation of the beam PB. The desired attenuation of the beam PB is achieved by adjusting the gas present in the chamber 418 with respect to its physical properties and/or the composition of the gas. Beam transmission through a medium is given by the relation:

$$\frac{I}{I_0} = e^{-\rho \cdot \mu \cdot d}$$

where I is beam intensity after traveling a distance d, $I_0$ is the initial beam intensity, $\rho$ is the density of the medium, and $\mu$ is the absorption cross section of the medium.

For a gas, the density is determined by the gram formula weight of the gas, the temperature, and the pressure; and the absorption cross section is a property of the constituents of the gas. Depending on the particular values for these settings, a nearly linear attenuation or attenuation over a greater range may be obtained. Additionally, it is desirable for the average number of gas particles that interact with the beam PB to be accurately controlled, which may require some form of calibration of the attenuation variables.

A first possibility to control the attenuation is thus to vary the density ($\rho$). This can be done by varying the pressure in the chamber 418 using control valves 414, 415 to adjust the supply and the egress flow. A low density of gas in a large volume, such that the mean free path is about 1-10 cm, may provide a more uniform attenuation region than relatively high density of gas.

A second possibility is to vary the length of the path of the beam through the gas (d). This can be done by varying the distance between the end faces 411, 412 and/or varying the distance between the supply control valve 414 and the egress control valve 415. It may be advantageous to create asymmetric path lengths by, for instance, tilting one or both of the end faces 411, 412 with respect to the beam PB.

A third possibility is to vary the effective absorption cross section of the gas ($\rho$) by supplying the chamber 418 with a plurality of gases, each one with its own supply 413 and control valves 414. In this way, the attenuation may further be adjusted by varying the partial pressures of the gas constituents present in the chamber 418.

The radiation attenuator may be situated at any convenient position in the optical path of the beam from radiation source to substrate and may be used for energy control of the beam. With a suitably high pressure gas supply 413 and vacuum pumps 416 for extraction of the radiation absorbing gas of sufficient capacity, the reaction time of the radiation attenuator can be much faster than a system for mechanically swapping filters into the beam path. An additional advantage is that the absorbent region of gas may prevent debris passing through the attenuator with the beam.

Figure 4B:
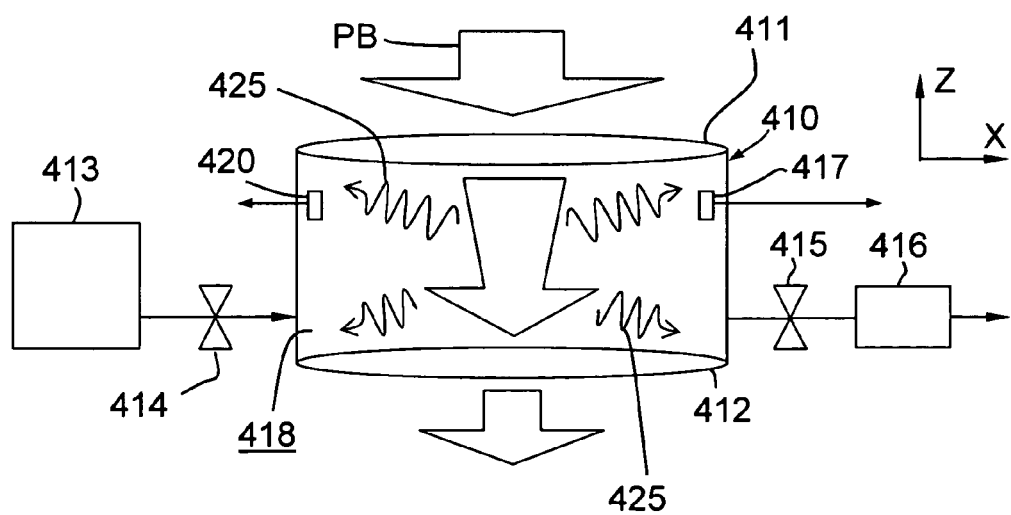
FIG. 4B is a cross-sectional view of a combined controllable radiation absorber and radiation energy sensor according to the present invention.

The radiation attenuator can easily be modified to function as both a radiation attenuator and a radiation-energy detector. As shown in FIG. 4B, the radiation attenuator further includes at least one radiation sensor 420 in the chamber 418 to detect radiation 425 in the chamber 418.

For certain combinations of gas and radiation wavelength, the radiation energy may be measured by detecting the interaction between the beam PB and the gas in the chamber 418. As the beam PB passes through the radiation attenuator, incoming radiation photons are absorbed by the particles (molecules/atoms) in the gas. Especially at shorter wavelengths, ions and free electrons may be created due to ionization. These free electrons may excite some of the gas particles, which in turn may produce photons 425 when they are subsequently de-excited. In addition, photons 425 may be created when the bound electron cloud surrounding the ions rearranges after colliding with free electrons. Both types of photons 425 are so called fluorescence photons because the luminescence only occurs during the irradiation of the interactive gas by the radiation. The fluorescence photons 425 are emitted in a plurality of directions, which allows the radiation sensor 420 to be disposed at the periphery of the chamber 418 such that it does not disrupt the energy profile of the beam PB. The amount of fluorescence photons 425 detected is a measure for the number of photons in the beam PB that are absorbed.

If the interaction between the beam PB and the gas produces fluorescence photons 425 in the ultraviolet-visible-infrared part of the electromagnetic spectrum, sensors such as a photodiode, a photomultiplier, and a light-dependent resistor (LDR) may be suitable to use as a radiation sensor 420. Using a plurality of radiation sensors 420 at different locations within the chamber 418 may improve the stability of the measurement as local fluctuations can be averaged out. The radiation sensor 420 may also be disposed outside the chamber 418 if the chamber 418 further comprises a window that transmits a sufficient amount of the fluorescence photons 425 for detection.

The most suitable interactive gas depends upon on various factors, including restrictions imposed by the rest of the system and the wavelength of the radiation used. For instance, nitrogen ($N_2$), oxygen ($O_2$), ozone ($O_3$), and inert gasses such as helium (He) may be suitable. When using a beam of radiation in the 5-20 nm range, argon (Ar) and xenon (Xe) may be particularly advantageous. As described above, the degree of interaction may be regulated by varying a physical property of the gas.

As the degree of interaction may be related to the degree of absorption, the radiation-energy detection may be used to regulate the attenuation. Further, if the energy of radiation in the beam PB entering the attenuator and the density of the gas particles in the chamber 418 are known, the amount of fluorescence photons 425 can be related to the energy of the beam PB leaving the attenuator. This can then be used to calculate the radiation energy eventually delivered to the substrate.

It may be particularly advantageous to employ different gasses for the absorption and energy sensing function to allow a more independent optimization of each function. If a plurality of gasses are employed, it may be further advantageous to measure fluorescence photons 425 in spectral regions which are characteristic for a certain interactive gas particle. Note that the region of interactive gas does not necessarily have to be provided by the supply 413, a certain amount of gas may be present in the chamber 418 as a residue gas, or for some other purpose.

Figure 4C:
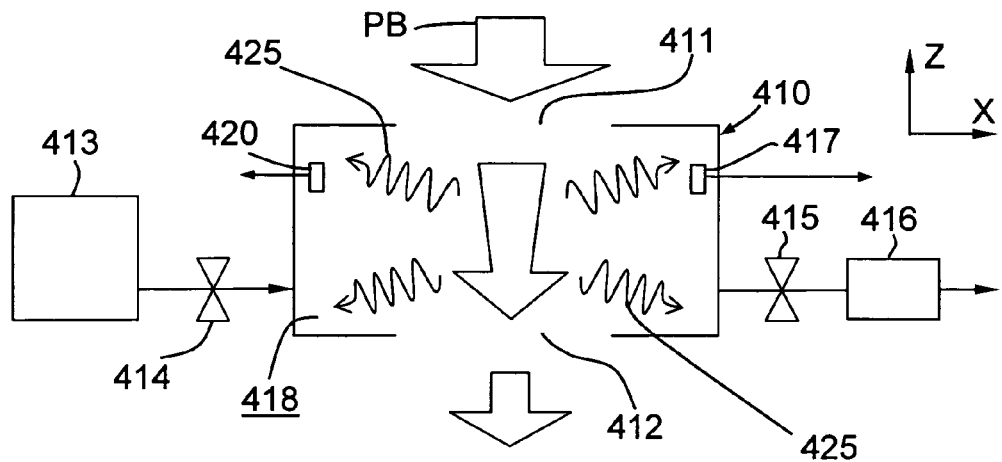
FIG. 4C is a cross-sectional view of a controllable radiation absorber suitable for short wavelengths sensor according to the present invention.

In some cases, the most suitable end faces 411,412 may be openings or apertures as shown in FIG. 4C. This may be advantageous when using a beam PB in the 5-20 nm wavelength range as this avoids the use of transmissive windows, for instance 100 nm of silicon, which may absorb up to 50% of the incident radiation.

If the embodiment described here is operated with a beam PB that requires the optical path to be evacuated (for example, in the wavelength range 5-20 nm), the pressure with which the gas emanates from the control valve 414 must be carefully chosen in order to obtain a small scale vacuum disturbance. This is achieved by suitable tuning of the control valves 414 and 415.

It may further be advantageous to separate the attenuation and energy sensing functions into separate units at separate locations in the optical path of the beam PB. This allows the parameters controlling the effectiveness of each unit, such as location, gas composition, gas pressure, gas flow to be optimized separately, and provides the possibility of both sensing the beam PB energy at one or more locations and attenuating the beam PB at one or more locations.

In this embodiment, fluorescence is employed to sense the energy of the radiation. However, there are many types of interaction between radiation and a gas which may also be exploited such as changes in temperature, pressure and chemical composition of the gas.

The radiation attenuator may also be arranged to have a controllably non-uniform concentration of absorbing gas and be used for filtering diffraction orders of radiation diffracted at the mask upon traversing the mask.

Figure 5:
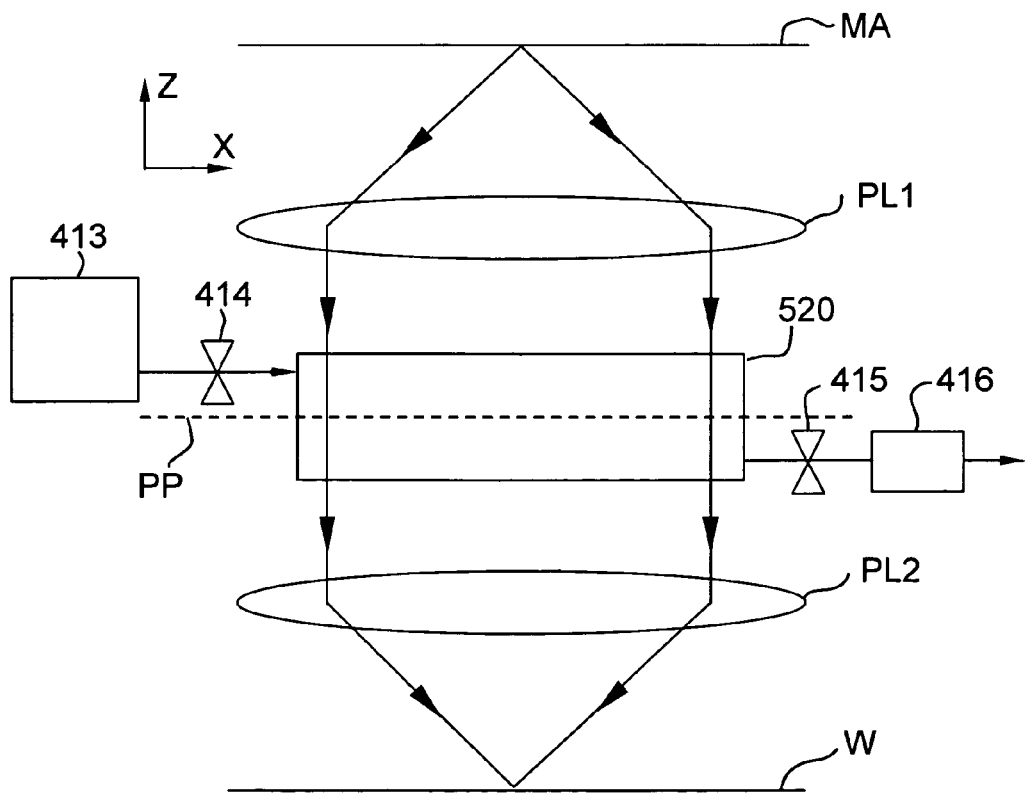
FIG. 5 is a diagram showing a controllable radiation absorber positioned in a pupil plane of a lithographic projection apparatus according to the present invention.

FIG. 5 is a simplified schematic of the optical system of a lithographic projection apparatus from mask MA to substrate W. Within the projection system PL, represented schematically in this figure by two lenses PL1, PL2, is at least one pupil plane PP of the projection system. At the pupil plane PP, the energy distribution of the patterned beam is a Fourier transform of the pattern on the mask. The various diffraction orders of the patterned beam, which are separated in angle at the mask, are separated in space at the pupil plane PP. Accordingly, the diffraction orders can be selectively filtered using a filter of non-uniform transparency. This can be achieved by using radiation attenuator 520 which has a non-uniform concentration of radiation absorbing gas and is situated around or close to the pupil plane. The non-uniform gas may be achieved by dividing the chamber of the radiation attenuator 520 into a plurality of cells placed side-by-side in the pupil plane and having individually controllable gas supplies and evacuation pumps. Alternatively, the radiation attenuator 520 may be provided with gas inlets and outlets arranged to establish a dynamic gradient in the gas concentration.

Figure 6A:
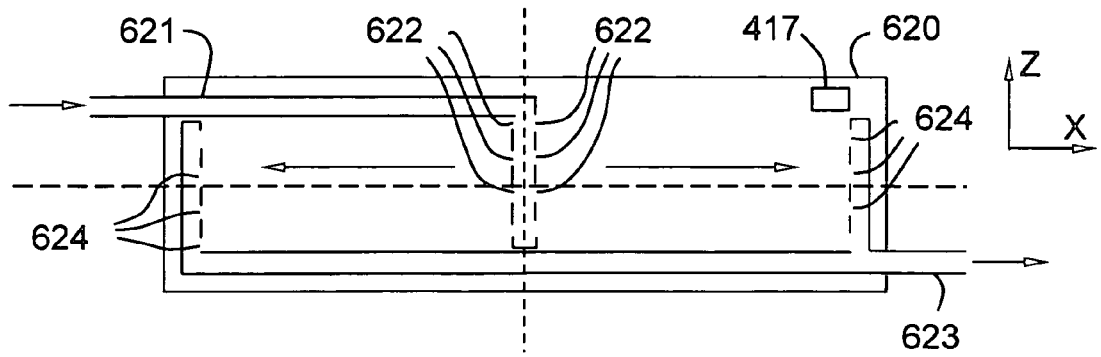
FIG. 6A is a cross-sectional view of the controllable radiation absorber of FIG. 5.

A radiation attenuator 620 of the latter type is illustrated in FIG. 6A. In this attenuator, radiation absorbing gas is supplied via a conduit 621 which extends in to the chamber of the attenuator 620 and has one or a plurality of outlets 622 arranged near the optical axis of the projection system PL. Gas is removed from the chamber via conduit 623 which has a plurality of inlets 624 distributed around the periphery of the chamber. By suitable control of the rate of supply of gas and the rate at which it is removed from the chamber, which will depend on the pressure at the outlet(s), a dynamic equilibrium with a radially symmetric gas distribution gradient can be established.

Figure 6B:
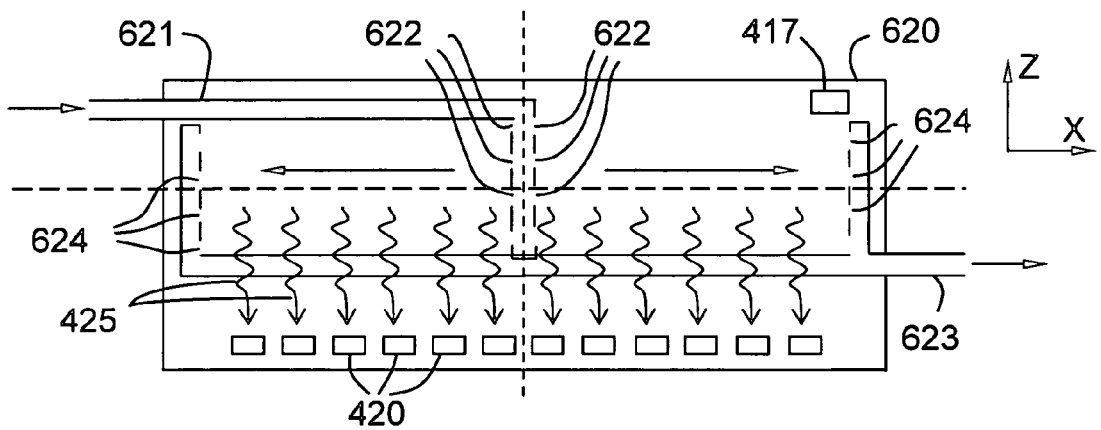
FIG. 6B is a cross-sectional view of a combined controllable radiation absorber and radiation energy sensor according to the present invention.

This embodiment of the radiation attenuator can also be modified to function as both a radiation attenuator and a radiation-energy detector. The non-uniform nature of the beam PB and gas interaction will result in a non-uniform concentration in the fluorescence photons 425, so the most useful configuration may be a radiation attenuator further comprising a plurality of radiation sensors 420 (or an array of sensor elements such as a CCD camera) as shown in FIG. 6B.

The radiation attenuator may also be used to reduce energy variations across the exposure slit, especially in a scanning projection apparatus.

Figure 7A:
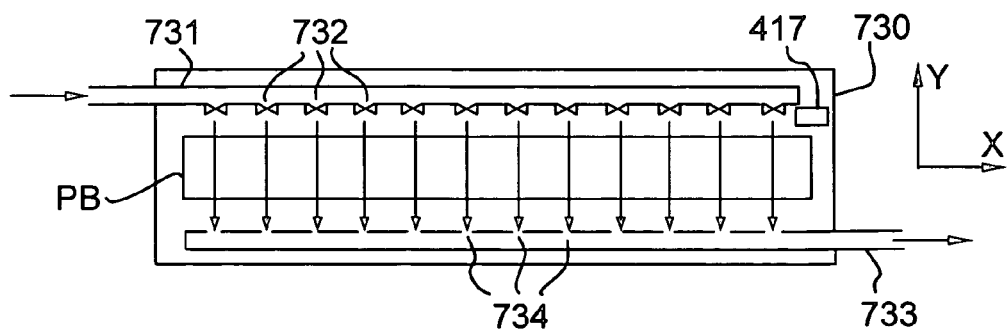
FIGS. 7A and 7B are cross-sectional views of a controllable radiation absorber according to the present invention.

FIG. 7A is a cross-section perpendicular to the optical axis of the radiation attenuator 730 suitable for being situated in the lithographic projection apparatus at a position where the beam profile perpendicular to the optical axis is substantially the same as at substrate level. For example, the radiation attenuator 730 may be positioned at or near the plane of the mask or the substrate, or any plane in the radiation system or the projection system that is substantially conjugate to these planes.

Radiation absorbing gas is supplied via conduit 731 to a plurality of (micro-)jets 732 arrayed adjacent to the beam PB, which has the cross-section of the exposure slit in the plane perpendicular to the optical axis. The array of jets 732 is substantially perpendicular to the scanning direction, e.g. the Y-direction. Opposite the array of jets 732 is a corresponding array of evacuation orifices 734 which are connected to a suitable vacuum pump via conduits 733. Each of jets 732 has an independently controllable valve to control the rate of flow of absorbent gas through it. By appropriate control of these valves and by ensuring that the rate of evacuation of gas from the chamber is suitably high, the concentration, and thus the physical properties (e.g. density, pressure, mean free path), of radiation absorbing gas can be varied along the length of the slit so as to compensate for energy variations in the projection beam perpendicular to the scanning direction and ensure uniform illumination at substrate level. Note that energy variations parallel to the scanning direction are averaged out by the scanning process itself.

Alternatively, the radiation attenuator can be modified to supply each jet 732 with a plurality of gasses, allowing energy variations to be compensated by changing the variety of the gas supplied to each jet 732. It is also possible that the geometry, position and relative position of the jets 732 and/or the orifices 734 are made adjustable to permit a wider range of energy variations to be corrected. In some configurations, a single evacuation orifice 734 may be advantageous.

If the radiation attenuator is to be used in an evacuated system, it is desirable for the gas injected through the jets 732 to be confined as much as possible within the attenuator itself. This can be achieved by using a speed of gas ejection from the jets 732 that is larger than the speed of sound, and preferably 10 times the speed of sound. These speeds minimize the divergence of the gas as it flows from jet 732 to orifice 734, and is best achieved with inert gasses like xenon (Xe), nitrogen (N) and argon (Ar).

Energy variations in the beam PB can be measured using, for example, a photodiode, e.g. a so-called "spot-sensor", or an image sensor, e.g. a Transmission Image Sensor (TIS). An example of a TIS of this type is described in greater detail in U.S. Pat. No. 4,540,277. A suitable control system to vary the absorbing gas concentration to effect the desired uniformity can easily be provided. An additional advantage is that the absorbent region of gas forms a kind of curtain that may prevent debris passing through the attenuator with the beam.

This configuration provides a further possibility to control the attenuation, namely changing the geometry of the gas jets 732. The design of the mouth of each jet 732 may influence parameters such as the speed of the gas and the area that the absorbing gas may eventually reach.

The radiation attenuator of FIG. 7A may be disposed in the lithographic projection apparatus at a position where the beam profile perpendicular to the optical axis has a different form, for example, approximately circular. The radiation attenuator 930 shown in FIG. 7B has been modified by increasing the distance between the supply jets 732 and the evacuation orifices 734.

At some locations in the optical path, it may be advantageous to control the absorption of the beam PB at more points by using more gas jets. FIG. 7C is a cross-section perpendicular to the optical axis of a radiation attenuator 830 that includes a second array of (micro-)jets 832 arrayed adjacent to the beam PB and a corresponding second array of evacuation orifices 834. The second array of evacuation orifices 834 are connected to a suitable vacuum pump via conduit 833, and radiation absorbing gas is supplied via conduit 831 to the second array of jets 832. The second array of jets 832 and orifices 834 are disposed substantially perpendicular to the first array of jets 732 and orifices 734. Further, the first array of jets 732 and orifices 734 are disposed to create a first region of radiation absorbing gas substantially in a first XY plane, and the second array of jets 832 and orifices 834 are disposed to create a second region of radiation absorbing gas substantially in a second XY plane at non-zero distance in Z from the first XY plane. FIG. 7D is a cross-section along the optical axis of the radiation attenuator 830 which shows the relative disposition in Z between the first XY plane, indicated by evacuation conduit 733, and the second XY plane, indicated by the supply conduit 831 and the evacuation conduit 833.

Figure 7B:
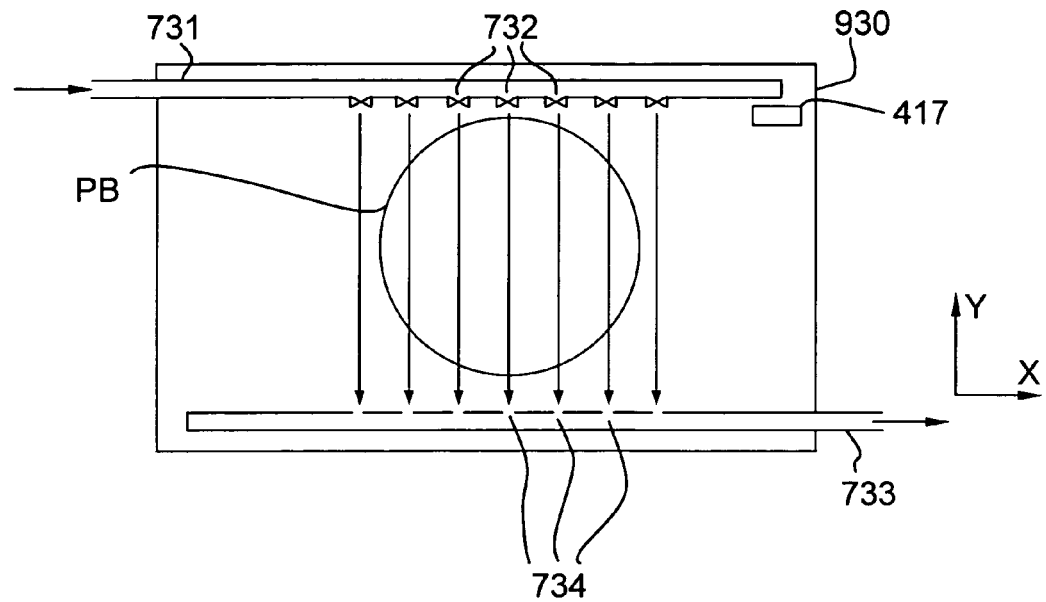
Figure 7C:
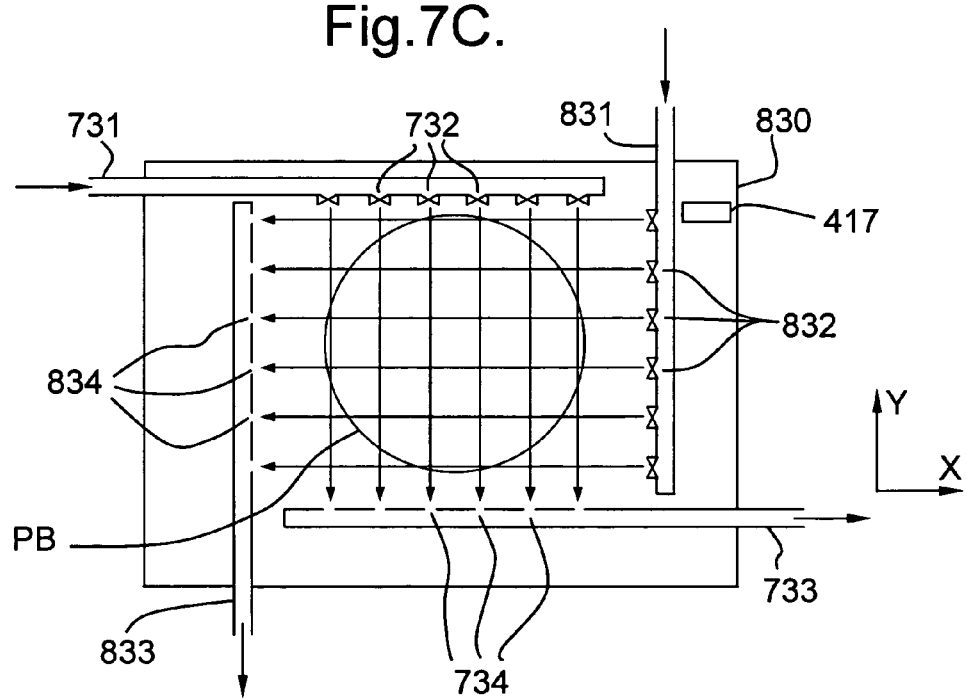
FIG. 7C is a first cross-sectional view of a radiation attenuator using two Controllable radiation absorbers according to the present invention.
Figure 7D:
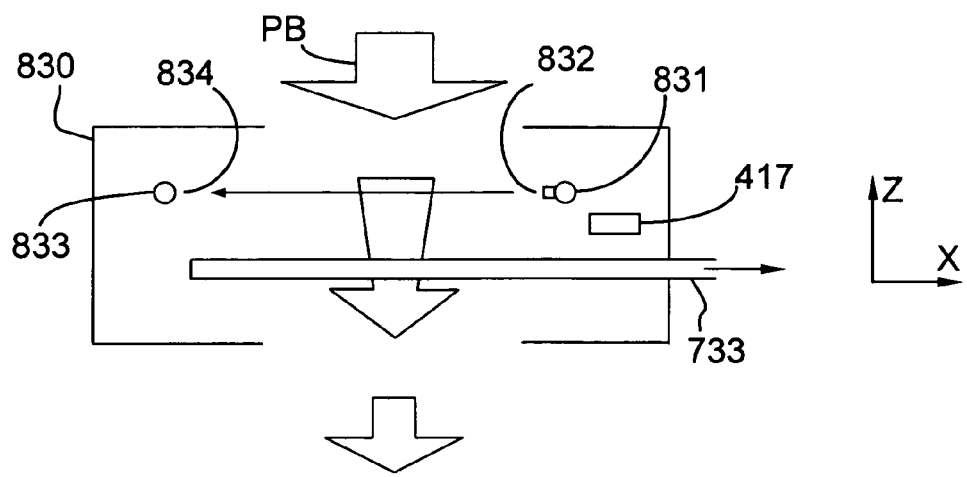
FIG. 7D is a second cross-sectional view of a radiation attenuator using two controllable radiation absorbers according to the present invention.
Figure 7E:
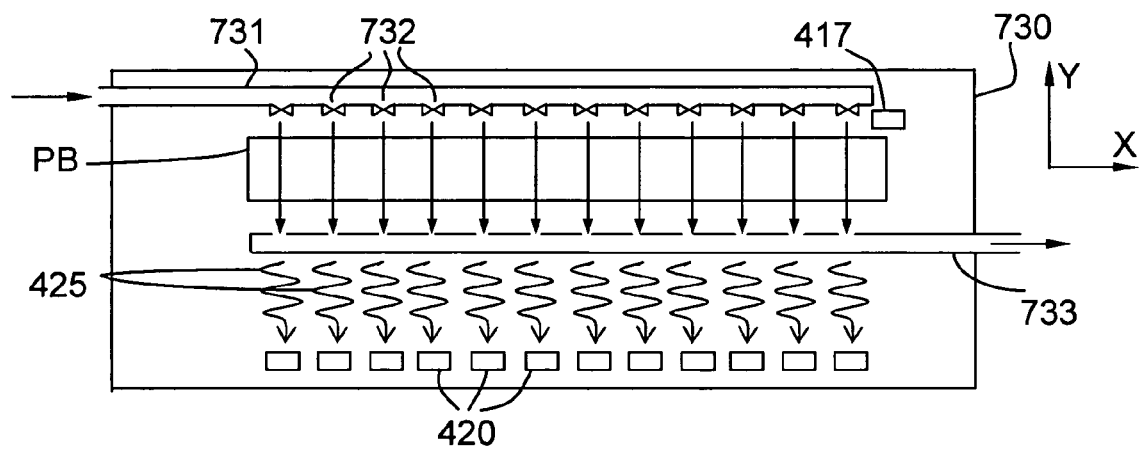
FIGS. 7E and 7F are cross-sectional views of a combined controllable radiation absorber and radiation energy sensor according to the present invention.

The radiation attenuator 730 from FIG. 7A may be modified to function as both a radiation attenuator and a radiation-energy detector, as shown in FIG. 7E. The radiation attenuator 730 further includes at least one sensor 420 proximate to the volume within which the radiation beam PB interacts with the gas injected through the array of jets 732. Preferably, an array of sensors 420 (or an array of sensor elements) is used to measure the fluorescence photons 425 at different points in the interaction region between the beam PB and the gas. If required, the parameters of the attenuator 730 may be adjusted to create a uniform region of gas in the region where the gas interacts with the beam PB, the measurements by the sensors 420 indicate the energy uniformity in the beam PB.

Figure 7F:
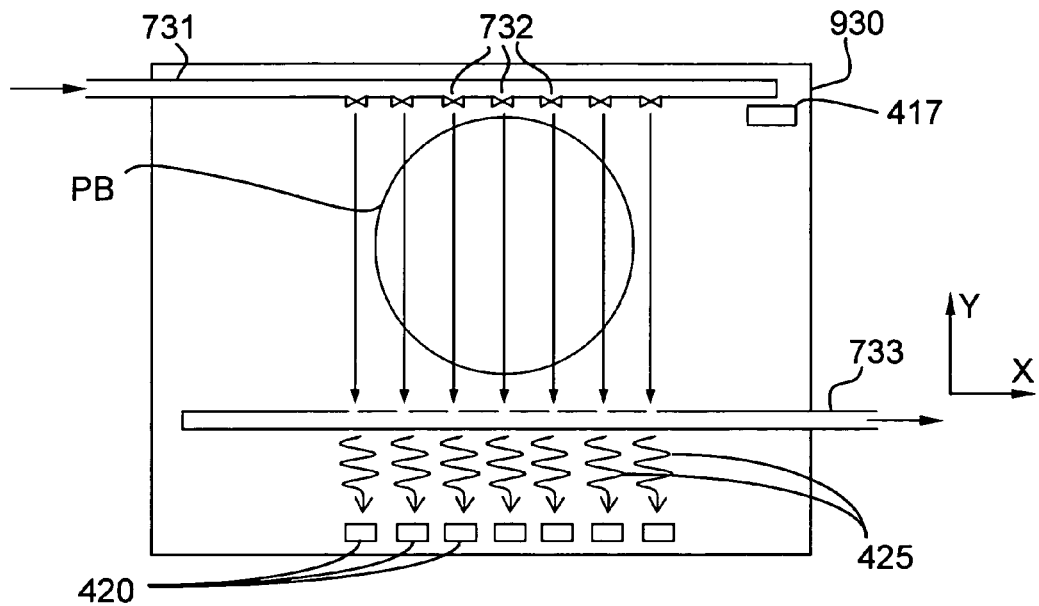
Figure 7G:
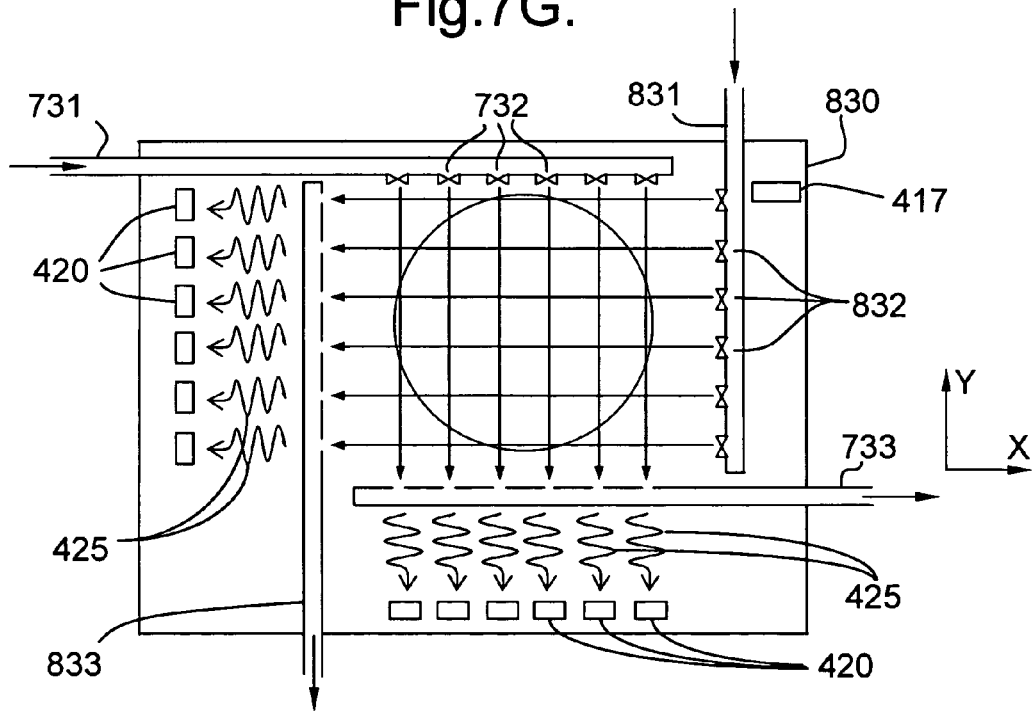
FIG. 7G is a cross-sectional view of a combined radiation attenuator and sensor using two controllable radiation absorbers and radiation energy sensors according to the present invention.

In a similar way, the radiation attenuator 930 from FIG. 7B may also be modified to function as both a radiation attenuator and a radiation-energy detector, as shown in FIG. 7F. The radiation attenuator 930 further includes at least one sensor 420 proximate to the volume within which the radiation beam PB interacts with the gas injected through the array of jets 732. Similarly, the radiation attenuator 830 from FIG. 7C may also be modified to function as both a radiation attenuator and a radiation-energy detector, as shown in FIG. 7G. The radiation attenuator 930 further includes at least one sensor 420 (or sensor elements) for the interactions within the first region of absorbing gas and at least one sensor 820 for the interactions within the second region of absorbing gas.

Figure 8A:
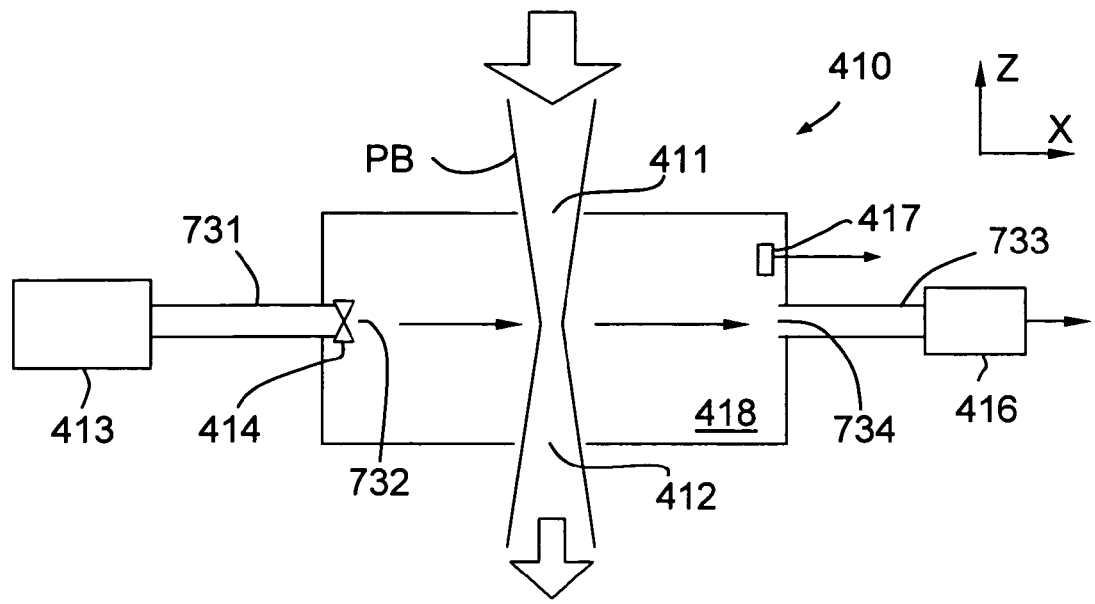
FIG. 8A is a cross-sectional view of a controllable radiation absorber according to the present invention.

The radiation attenuator 410 may be disposed proximate to an optical focal plane (intermediate focus). FIG. 8A shows the radiation attenuator in cross-section through the optical axis, in which the focus of the beam PB substantially coincides with the absorbing gas flowing from the jet 732 to the evacuation orifice 734. The proximity to a focal plane means that the transmissive end faces 411 and 412 can be made as small as possible. This configuration is particularly advantageous when using apertures as end faces 411, 412 (for example, in the case of a beam PB with a wavelength in the 5-20 nm range through an evacuated system) because the apertures 411, 412 can be kept as small as possible and consequently the diffusion of radiation absorbing gas out of the chamber 418 is minimized. The spread of the gas is further minimized because the reduction in the cross-sectional area of the beam PB proximate an intermediate focus means that a confined stream from the jet 732 to the evacuation orifice 734 may be used. However, radiation attenuator may also be positioned at locations that do not substantially coincide with a focal plane.

Figure 8B:
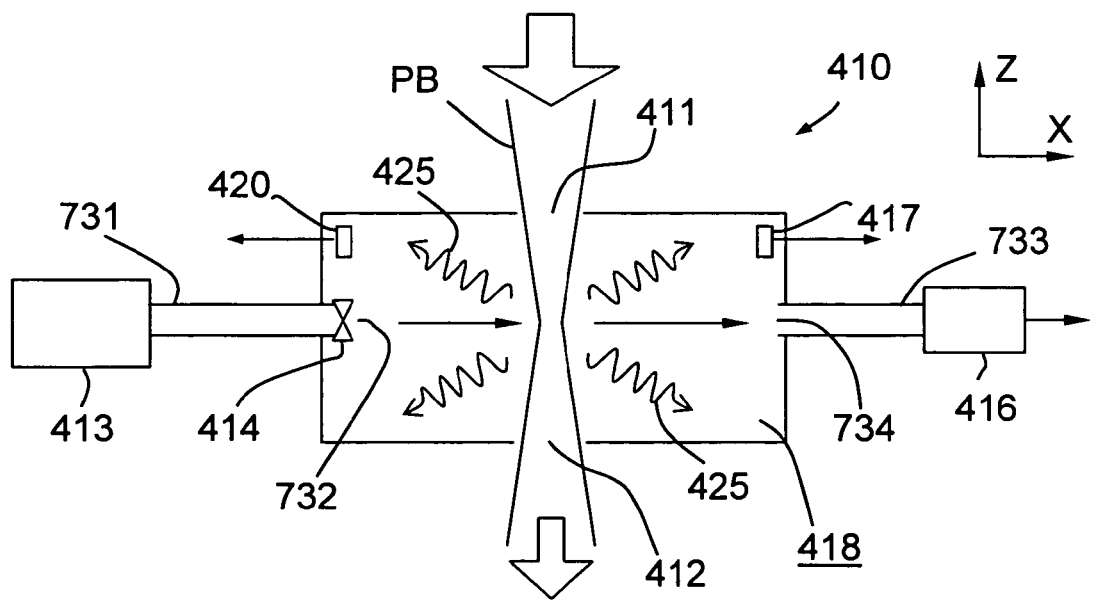
FIG. 8B is a cross-sectional view of a combined controllable radiation absorber and radiation energy sensor according to the present invention.

FIG. 8B shows the radiation attenuator 410 modified to further to function as both a radiation attenuator and a radiation-energy detector in a similar way to that already described.

The radiation energy detection may be performed using a charge-particle flux detector. The charged-particles are created when a beam PB passing through a region of gas ionizes a number of gas molecules proportional to the energy of the beam and the number of molecules in the region. This ionization effect becomes more pronounced as the wavelength of the radiation decreases, for example when the beam PB has a wavelength in the 5-20 nm range.

Figure 9:
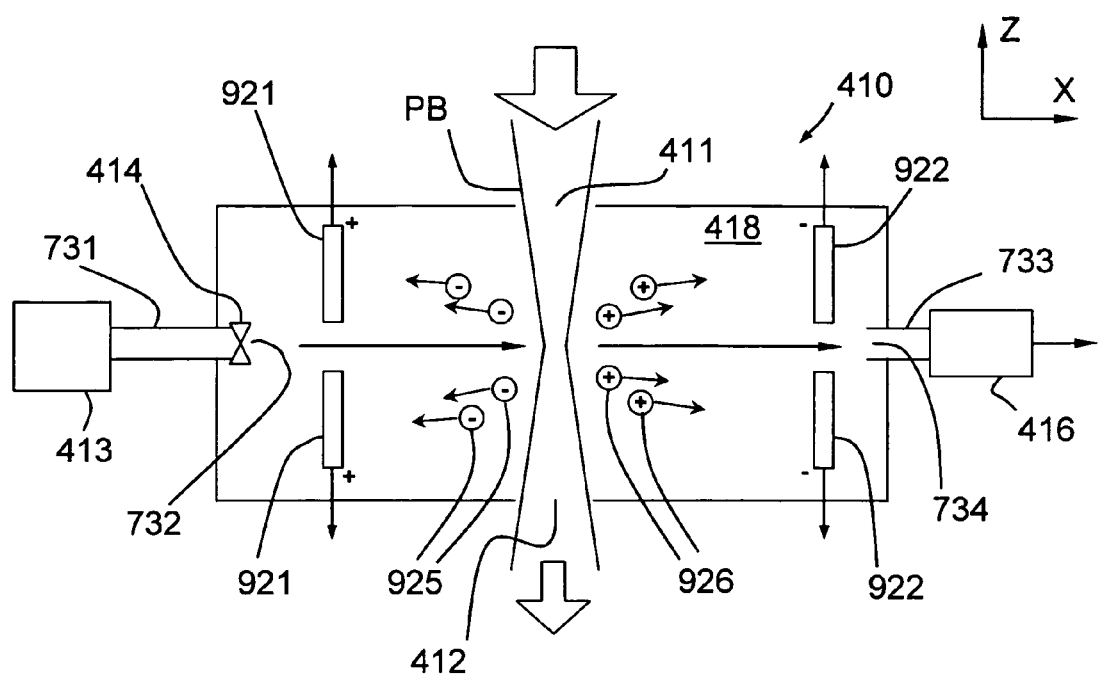
FIG. 9 is a cross-sectional view of a combined controllable radiation absorber and radiation energy sensor according to the present invention.

In the combined radiation attenuator and radiation-energy detector 410 shown in FIG. 9, the beam PB is focused at an optical focal plane which substantially coincides with a gas stream from the jet 732 to the evacuation orifice 734. The radiation attenuator further includes sensors 921, 922 to detect charged particles. Positive ions 926 are detected by sensor 922, such as a negatively-charged detection grid, and negative particles 925, e.g. electrons, by a sensor 921, such as a positively-charged detection plate. Preferably, the sensor 921 is disposed proximate the gas jet 732 and the sensor 922 is disposed proximate the evacuation orifice 734.

During interaction of the beam PB and the stream of gas from the jet 732, charged particles such as (positively charged) ions 926 and (negatively charged) electrons 925 are created proportional to the energy of the beam PB and the density of gas in the intersection region. The charged sensors 921, 922 attract the respective charged particle 926, 925, thus providing for measuring the degree of interaction and thus the energy of the beam PB. If an array of sensors is used in a similar fashion to the other embodiments of the invention, local variations in the interaction may also be measured.

While specific embodiments of the present invention have been described above, it will be appreciated that the invention may be practiced otherwise than as described. The description is not intended to limit the invention. Further, it will be appreciated that a controller to regulate the radiation energy delivered to the substrate during an exposure may comprise any suitable combination of measurement and attenuation techniques. Although some of the embodiments provide both measurement and attenuation function at one location, it may be advantageous to implement these functions at separate locations or even to implement them at a plurality of locations. It will also be appreciated that several measurement and attenuation techniques described in the embodiments may be combined with each other and with other known techniques.

What is claimed is:

1. A lithographic projection apparatus for imaging a pattern onto a substrate that is at least partially covered by a layer of radiation-sensitive material, the apparatus comprising:
   a radiation system configured to provide a beam of radiation;
   a support configured to support a patterning structure, the patterning structure configured to produce a desired pattern in the beam of radiation;
   a substrate table configured to hold a substrate;
   a projection system configured to project the patterned beam of radiation onto a target portion of the substrate; and
   a radiation absorber comprising a gas supply configured to supply an absorbent gas at a controlled concentration to at least one enclosure traversed by the beam of radiation, the absorbent gas serving to absorb radiation energy delivered by the beam of radiation to the substrate during exposure of the radiation-sensitive material to the patterned beam of radiation,
   wherein the radiation absorber is configured to have a gas concentration in a path of the beam of radiation that is controllably non-uniform in an unobstructed plane perpendicular to an optical axis of the radiation system, or the projection system, or both the radiation system and the projection system, and
   wherein the beam of radiation traverses through a top surface and a bottom surface of the at least one enclosure, the top and bottom surfaces substantially parallel to each other, while avoiding interaction with an optical element between the top and bottom surfaces of the at least one enclosure.

2. An apparatus according to claim 1, wherein the radiation absorber is configured and arranged to adjust at least one of:
   radiation power emitted by a radiation source configured to supply radiation to the radiation system;
   a uniformity of energy of the beam of radiation perpendicular to an optical axis of the apparatus;
   a radiation energy of pulses of radiation emitted by the radiation source;
   a duration of an exposure of a target portion; and
   an angular distribution of the radiation energy delivered by the beam of radiation.

3. An apparatus according to claim 1, wherein the radiation absorber is located proximate to at least one of: a pupil plane of the projection system; a plane of the patterning structure; a plane of the substrate; a conjugate plane of the pupil plane; a conjugate plane of the patterning structure plane; and a conjugate plane of the substrate plane.

4. An apparatus according to claim 1, wherein the enclosure is substantially transparent to the beam of radiation in a direction parallel to its direction of propagation.

5. An apparatus according to claim 4, wherein the enclosure further comprises a first aperture configured to allow the beam of radiation to enter the enclosure, and a second aperture configured to allow the beam of radiation to exit the enclosure.

6. An apparatus according to claim 1, wherein the beam of radiation has a focal point and the absorption of the beam by the absorbent gas is located at the focal point.

7. An apparatus according to claim 1, wherein, in use, an optical path of the beam of radiation is substantially evacuated.

8. An apparatus according to claim 1, wherein the radiation system is configured to provide radiation comprising a wavelength in the range of 5 nm to 20 nm.

9. An apparatus according to claim 1, wherein the radiation absorber further comprises a gas extractor configured to extract the absorbent gas from the enclosure.

10. An apparatus according to claim 1, wherein, in use, a speed at which the absorbent gas enters the enclosure is approximately greater than the speed of sound in the absorbent gas.

11. An apparatus according to claim 1, wherein, in use, a speed at which the absorbent gas enters the enclosure is approximately ten times the speed of sound in the absorbent gas.

12. An apparatus according to claim 1, wherein the gas supply is configured to supply the absorbent gas mixed at a controlled concentration with a purge gas.

13. An apparatus according to claim 1, wherein the radiation system is configured to provide radiation comprising a wavelength less than 365 nm.

14. An apparatus according to claim 1, wherein the radiation absorber is arranged to have a gas concentration that is substantially symmetric about the optical axis.

15. An apparatus according to claim 1, wherein the at least one enclosure comprises at least one of a pupil plane of the projection system and a conjugate plane of the pupil plane.

16. An apparatus according to claim 1, wherein the radiation absorber is arranged to have a gas concentration that is controllably variable in a direction perpendicular to a scanning direction in which the substrate table is moved during a scanning exposure.

17. An apparatus according to claim 16, wherein the radiation absorber is located proximate to at least one of: a plane of the patterning structure; a plane of the substrate; a conjugate plane of the patterning structure plane; and a conjugate plane of the substrate plane.

18. An apparatus according to claim 1, wherein a mean free path of the absorbent gas within the at least one enclosure is in the range of 1 mm to 10 cm.

19. An apparatus according to claim 1, wherein the radiation absorber further comprises a controller configured to control at least one physical property of the absorbent gas.

20. An apparatus according to claim 19, wherein the physical property of the absorbent gas is at least one of: an absorbent gas pressure; a path length of the beam of radiation through the absorbent gas; and a composition of the absorbent gas.

21. An apparatus according to claim 1, wherein the radiation absorber comprises a plurality of gas supplies configured to supply a plurality of different absorbent gases at controlled concentrations to the at least one enclosure.

22. An apparatus according to claim 1, wherein the absorbent gas comprises at least one of: oxygen (O); nitrogen (N); helium (He); neon (Ne); argon (Ar); krypton (Kr); xenon (Xe); water (H$_2$0); a hydrocarbon; and a compound or mixture of any combination of the foregoing.

23. A device manufacturing method, comprising:
projecting a patterned beam of radiation onto a target portion of a layer of radiation-sensitive material at least partially covering a substrate;
controlling an energy of the patterned beam, or a duration of exposure of the radiation-sensitive material to the patterned beam, or both the energy and the duration, such that a desired dose of radiation is delivered to the substrate; and
supplying an absorbent gas according to a concentration profile to an enclosure traversed by the beam of radiation to effect a desired attenuation of the patterned beam, the absorbent gas absorbing a wavelength of the radiation, the concentration varying across at least part of an unobstructed space traversed by the beam in a direction substantially perpendicular to a direction of the beam,
wherein the beam of radiation traverses through a top surface and a bottom surface of the enclosure, the top and bottom surfaces substantially parallel to each other, while avoiding interaction with an optical element between the top and bottom surfaces of the enclosure.

24. A device manufacturing method, comprising:
projecting a patterned beam of radiation onto a target portion of a layer of radiation-sensitive material at least partially covering a substrate;
controlling an energy profile of the patterned beam of radiation, such that a desired radiation uniformity is delivered to the substrate during an exposure; and
supplying an absorbent gas according to a concentration profile to an enclosure traversed by the beam of radiation to effect a desired non-uniform attenuation of the patterned beam, the absorbent gas absorbing a wavelength of the radiation, the concentration varying across at least part of an unobstructed space traversed by the beam in a direction substantially perpendicular to a direction of the beam,
wherein the beam of radiation traverses through a top surface and a bottom surface of the enclosure, the top and bottom surfaces substantially parallel to each other, while avoiding interaction with an optical element between the top and bottom surfaces of the enclosure.

25. A lithographic projection apparatus for imaging a pattern onto a substrate that is at least partially covered by a layer of radiation-sensitive material, the apparatus comprising:
a radiation system configured to provide a beam of radiation;
a support configured to support a patterning structure, the patterning structure configured to produce a desired pattern in the beam of radiation;
a substrate table configured to hold a substrate;
a projection system configured to project the patterned beam of radiation onto a target portion of the substrate; and
an enclosure having a top surface and a bottom surface, the beam of radiation traversing through the top and bottom surfaces of the enclosure, and having a radiation-energy detector configured to determine the energy of the beam of radiation, the beam of radiation passing at least partly through a region of interactive gas,
wherein the detector comprises a sensor located within the enclosure and configured to output a signal that represents an interaction of the beam of radiation with the region of gas, and to measure, out of a path of the beam of radiation, particles scattered from the path of the beam of radiation due to the interaction to determine the amount of interaction of the beam of radiation with the region of gas.

26. An apparatus according to claim 25, wherein the radiation-energy detector is located proximate to at least one of: a pupil plane of the projection system; a plane of the patterning structure; a plane of the substrate; a conjugate plane of the pupil plane; a conjugate plane of the patterning structure plane; and a conjugate plane of the substrate plane.

27. An apparatus according to claim 25, wherein the radiation-energy detector further comprises a gas supply configured to supply the interactive gas at a controlled concentration to the enclosure traversed by the beam of radiation.

28. An apparatus according to claim 27, wherein the gas supply is configured to supply the interactive gas mixed at a controlled concentration with a purge gas.

29. An apparatus according to claim 27, wherein the radiation-energy detector further comprises a gas extractor to extract the interactive gas from the enclosure.

30. An apparatus according to claim 27, wherein, in use, a speed at which the interactive gas enters the enclosure is approximately greater than the speed of sound in the absorbent gas.

31. An apparatus according to claim 27, wherein, in use, a speed at which the interactive gas enters the enclosure is approximately ten times the speed of sound in the absorbent gas.

32. An apparatus according to claim 25, wherein the radiation system is configured to provide radiation comprising a wavelength less than 365 nm.

33. An apparatus according to claim 25, wherein the enclosure at least partially surrounds the region of interactive gas and is substantially transparent to the beam of radiation in a direction parallel to its direction of propagation.

34. An apparatus according to claim 33, wherein the enclosure further comprises a first aperture configured to allow the beam of radiation to enter the enclosure, and a second aperture configured to allow the beam to exit the enclosure.

35. apparatus according to claim 25, wherein, in use, the beam of radiation has a focal point and the interaction of the beam of radiation with the region of interactive gas is substantially located at the focal point.

36. An apparatus according to claim 25, wherein, in use, the optical path of the beam of radiation is substantially evacuated.

37. An apparatus according to claim 25, wherein the radiation system is configured to provide radiation comprising a wavelength in the range of 5 nm to 20 nm.

38. An apparatus according to claim 25, wherein the interactive gas comprises at least one of: oxygen (O); nitrogen (N); helium (He); neon (Ne); argon (Ar); krypto; (Kr); xenon (Xe); water (H$_2$O); a hydrocarbon; and a compound or mixture of any combination of the foregoing.

39. An apparatus according to claim 25, wherein the radiation-energy detector is configured to measure the interaction of the beam of radiation with the region of gas at a plurality of points along a plane perpendicular to an optical axis of the radiation system, or the projection system, or both the radiation system and the projection system.

40. An apparatus according to claim 25, wherein the radiation-energy detector is located proximate to at least one of a pupil plane of the projection system and a conjugate plane of the pupil plane.

41. An apparatus according to claim 25, wherein the radiation-energy detector is configured to measure the interaction of the beam with the region of gas at a plurality of points in a direction perpendicular to a scanning direction in which the substrate table is moved during a scanning exposure.

42. An apparatus according to claim 25, wherein the radiation-energy detector is located proximate to at least one of: a plane of the patterning structure; a plane of the substrate; a conjugate plane of the patterning structure plane; and a conjugate plane of the substrate plane.

43. An apparatus according to claim 25, wherein the sensor is sensitive to a range of electromagnetic radiation including: visible light; ultra violet (UV) light; and infra red (IR) light.

44. An apparatus according to claim 25, wherein the sensor is sensitive to a type of charged particle including: positive ions; negative ions; and electrons.

45. An apparatus according to claim 44, wherein the sensor further comprises an electrode configured to be charged at a potential, which is opposite in sign to the type of charged particle.

46. An apparatus according to claim 25, wherein the radiation-energy detector further comprises a controller configured to receive the output signal, the controller in response to the output signal being configured to control at least one physical property of the interactive gas.

47. An apparatus according to claim 46, wherein the physical property of the interactive gas is at least one of: an interactive gas pressure; a path length of the beam through the interactive gas; and a composition of the interactive gas.

48. An apparatus according to claim 25, wherein the radiation-energy detector further comprises a plurality of gas supplies configured to supply a plurality of different interactive gases at controlled concentrations to an enclosure traversed by the beam.

49. A device manufacturing method, comprising:
projecting a patterned beam of radiation onto a target portion of a layer of radiation-sensitive material at least partially covering a substrate;
controlling an energy of the patterned beam of radiation, or a duration of exposure of the radiation-sensitive material to the patterned beam of radiation, or both the energy and the duration, such that a desired dose of radiation is delivered to the substrate during an exposure;
directing the patterned beam of radiation through an enclosure having a top and bottom surface, wherein the beam of radiation traverses through the top and bottom surfaces of the enclosure; and
determining, with a sensor located within the enclosure, the energy of the radiation by supplying an interactive gas according to a concentration profile to the enclosure traversed by the radiation beam of radiation; and
measuring, with the sensor located within the enclosure, particles scattered from a path of the beam of radiation due to the interaction of the beam of radiation with the interactive gas to determine the amount of interaction of the beam of radiation with the interactive gas, wherein results of the measurement are used to control the energy and/or the duration.

50. A device manufacturing method, comprising:
projecting a patterned beam of radiation onto a target portion of a layer of radiation-sensitive material at least partially covering a substrate;
controlling an energy profile of the patterned beam, such that a desired radiation uniformity is delivered to the substrate during an exposure;
directing the patterned beam of radiation through an enclosure having a top and bottom surface, wherein the beam of radiation traverses through the top and bottom surfaces of the enclosure; and
determining, with a sensor located within the enclosure, the energy profile of the radiation by supplying an interactive gas to the enclosure traversed by the radiation; and
measuring, with the sensor located within the enclosure, particles scattered out of a path of radiation due to interaction of the radiation with the interactive gas to determine the amount of interaction of the radiation with the interactive gas at a plurality of points, wherein results of the measurement are used to control the energy profile of the patterned beam.

51. A lithographic projection apparatus for imaging a pattern onto substrate that is at least partially covered by a layer of radiation-sensitive material, the apparatus comprising:
a radiation system configured to provide a beam of radiation;
a support configured to support a patterning structure, the patterning structure configured to produce a desired pattern in the beam of radiation;
a substrate table configured to hold a substrate;
a projection system configured to project the patterned beam of radiation onto a target portion of the substrate; and
an enclosure having a top surface and a bottom surface, the beam of radiation traversing through the top and bottom surfaces of the enclosure, wherein the enclosure comprises:
a radiation absorber comprising a gas supply configured to supply an absorbent gas al a controlled concentration to an enclosure traversed by the beam of radiation, the absorbent gas serving to absorb radiation energy delivered by the beam of radiation to the substrate during exposure of the radiation-sensitive material; and
a radiation-energy sensor located within the enclosure, the sensor, in operation, providing an output signal that represents an interaction of the beam with the absorbent gas and measuring, out of a path of the beam of radiation, particles scattered from the path of the beam of radiation due to the interaction to determine the amount of interaction of the beam of radiation with the absorbent gas.

52. An apparatus according to claim 51, further comprising a controller configured to receive the output signal, the controller in response to the output signal being arranged to control at least one physical property of the absorbent gas.

53. A device manufacturing method, comprising:
projecting a patterned beam of radiation onto a target portion of a layer of radiation-sensitive material at least partially covering a substrate;
controlling the energy profile of the patterned beam, such that a desired radiation uniformity is delivered to the substrate during an exposure;
directing the patterned beam of radiation through an enclosure having a top and bottom surface, wherein the beam of radiation traverses through the top and bottom surfaces of the enclosure;
supplying an absorbent gas according to a concentration profile to the enclosure traversed by the beam of radiation to effect a desired non-uniform attenuation of the patterned beam of radiation, the absorbent gas absorbing a wavelength of the radiation; and
determining, with a sensor located within the enclosure, the energy profile of the radiation by measuring, out of a path of the beam of radiation, particles scattered from the path of the beam of radiation due to the interaction of the radiation with the absorbent gas to determine an amount of interaction of the radiation with the absorbent gas at a plurality of points, wherein results of the measurement are used to control the energy profile control of the patterned beam.

54. A device manufacturing method, comprising:

projecting a patterned beam of radiation onto a target portion of a layer of radiation-sensitive material at least partially covering a substrate;

controlling an energy of the patterned beam, or a duration of exposure of the radiation-sensitive material to the patterned beam, or both the energy and the duration, such that a desired dose of radiation is delivered to the substrate during an exposure;

directing the patterned beam of radiation through an enclosure having a top and bottom surface, wherein the beam of radiation traverses through the top and bottom surfaces of the enclosure;

supplying an absorbent gas according to a concentration profile to the enclosure traversed by the beam of radiation to effect a desired attenuation of the patterned beam of radiation, the absorbent gas absorbing the radiation wavelength; and determining, with a sensor located within the enclosure, the energy of the radiation by measuring, out of a path of the beam of radiation, particles scattered from the path of the beam due to the interaction of the radiation with the absorbent gas to determine an amount of interaction of the radiation with the absorbent gas, wherein results of the measurement are used to control the energy and/or the duration.

55. A lithographic projection apparatus for imaging a pattern onto a substrate that is at least partially covered by a layer of radiation-sensitive material, the apparatus comprising:

a radiation system configured to provide a beam of radiation;

a support configured to support a patterning structure, the patterning structure configured to produce a desired pattern in the beam of radiation;

a substrate table configured to hold a substrate;

a projection system configured to project the patterned beam of radiation onto a target portion of the substrate;

a concentration controlled enclosure of radiation absorbent gas, with a top surface and a bottom surface substantially parallel to each other, positioned to be traversed by the beam of radiation during exposure of the radiation-sensitive material, wherein the beam of radiation traverses through the top and bottom surfaces of the concentration controlled enclosure while avoiding interaction with an optical element between the top and bottom surfaces of the concentration controlled enclosure; and a plurality of gas supplies configured to supply a plurality of different absorbent gasses at controlled concentrations to the enclosure.

* * * * *

UNITED STATES PATENT AND TRADEMARK OFFICE
CERTIFICATE OF CORRECTION

| | | |
|---|---|---|
| PATENT NO. | : 7,508,487 B2 | |
| APPLICATION NO. | : 10/719065 | |
| DATED | : March 24, 2009 | |
| INVENTOR(S) | : Johannes C. H. Mulkens | |

It is certified that error appears in the above-identified patent and that said Letters Patent is hereby corrected as shown below:

Title Page, Item (75), Inventors section please add --Eric Catey, Danbury, CT (US)--.

Column 20, line 41 "35. apparatus according" should be --35. An apparatus according--.

Signed and Sealed this

Seventeenth Day of November, 2009

David J. Kappos
*Director of the United States Patent and Trademark Office*